(12) United States Patent
Saito

(10) Patent No.: US 11,013,143 B2
(45) Date of Patent: May 18, 2021

(54) ELECTRONIC DEVICE FOR LIQUID IMMERSION COOLING, POWER SUPPLY UNIT, AND COOLING SYSTEM

(71) Applicant: ExaScaler Inc., Tokyo (JP)

(72) Inventor: Motoaki Saito, Tokyo (JP)

(73) Assignee: EXASCALER INC., Tokyo (JP)

( * ) Notice: Subject to any disclaimer, the term of this patent is extended or adjusted under 35 U.S.C. 154(b) by 0 days.

(21) Appl. No.: 16/347,782

(22) PCT Filed: Nov. 12, 2016

(86) PCT No.: PCT/JP2016/083621
§ 371 (c)(1),
(2) Date: May 6, 2019

(87) PCT Pub. No.: WO2018/087905
PCT Pub. Date: May 17, 2018

(65) Prior Publication Data
US 2019/0357384 A1    Nov. 21, 2019

(51) Int. Cl.
*H05K 7/20* (2006.01)
*G06F 1/26* (2006.01)
(Continued)

(52) U.S. Cl.
CPC ........... *H05K 7/20236* (2013.01); *G06F 1/26* (2013.01); *H02M 7/2173* (2013.01); *H05K 7/14* (2013.01)

(58) Field of Classification Search
CPC ............... H05K 7/20236; H05K 7/203; H05K 7/20872–20881; H05K 7/20927–20936;
(Continued)

(56) References Cited

U.S. PATENT DOCUMENTS 6,212,088 B1 *  4/2001  Yoo ........................... H02J 1/00
                                                        363/146
10,674,637 B2 *  6/2020  Ishinabe ............ H05K 7/20781
(Continued)

FOREIGN PATENT DOCUMENTS

JP        S50090146 U     7/1975
JP          06169039 A    4/1986
(Continued)

OTHER PUBLICATIONS

International Preliminary Report on Patentability for International Patent Application No. PCT/JP2016/083621, dated May 23, 2019, 7 pages.

(Continued)

*Primary Examiner* — Zachary Pape
*Assistant Examiner* — Amir A Jalali
(74) *Attorney, Agent, or Firm* — Procopio, Cory, Hargreaves & Savitch LLP

(57) ABSTRACT

Provided is a power supply unit which is immersed and directly cooled in a coolant filled in a cooling apparatus. The power supply unit includes a unit substrate, and a voltage step-down device mounted on the unit substrate. The unit substrate includes a voltage input terminal for supplying an external power supply voltage, and a voltage output terminal. The voltage output terminal is electrically connected to a voltage input terminal of an electronic device. The power supply unit is mounted on a bottom of a cooling tank of the cooling apparatus so that the electronic device is positioned at an upper part of the power supply unit upon electrical connection between the electronic device and the power supply unit, and cooled by the coolant flowing from the bottom, or flowing from another section of the cooling tank. The unit substrate may be disposed apart from the bottom so as to form a flow channel which allows passage of the (Continued)

coolant between one surface of the unit substrate and the bottom. The voltage step-down device may be configured to include a converter module which steps down the external high voltage DC voltage from 200V to 420V to the DC voltage from 24V to 52V.

10 Claims, 12 Drawing Sheets

(51) Int. Cl.
    *H02M 7/217*     (2006.01)
    *H05K 7/14*     (2006.01)

(58) Field of Classification Search
    CPC ...... H05K 7/14; H05K 7/20763; H01L 23/44; H01L 23/46; H01L 23/473; G06F 1/20; G06F 1/26; G06F 2200/201; H02M 7/2173
    USPC .......... 361/699–700; 165/80.4–80.5, 104.33; 257/712, 714; 174/547–548
    See application file for complete search history.

(56) References Cited

U.S. PATENT DOCUMENTS

| | | | | |
|---|---|---|---|---|
| 10,674,641 | B2* | 6/2020 | Shepard | H05K 7/203 |
| 2005/0270812 | A1* | 12/2005 | Vinciarelli | H02M 3/157 363/65 |
| 2005/0286275 | A1* | 12/2005 | Ryu | H02J 1/08 363/45 |
| 2007/0053154 | A1* | 3/2007 | Fukuda | G11B 33/022 361/679.33 |
| 2007/0070583 | A1* | 3/2007 | Callsen | H02B 3/00 361/603 |
| 2007/0267741 | A1* | 11/2007 | Attlesey | H05K 7/20263 257/714 |
| 2008/0048049 | A1* | 2/2008 | Adams | A01M 7/0035 239/146 |
| 2010/0288327 | A1* | 11/2010 | Lisi | H01L 31/02021 136/244 |
| 2013/0207455 | A1* | 8/2013 | Doljack | H02J 7/0036 307/9.1 |
| 2013/0299232 | A1* | 11/2013 | Fitz-Patrick | H05K 5/02 174/547 |
| 2014/0198449 | A1* | 7/2014 | Osada | H01L 24/37 361/689 |
| 2014/0261216 | A1* | 9/2014 | Fosburg | A01K 63/06 119/267 |
| 2015/0280493 | A1* | 10/2015 | Cha | H02J 7/0029 307/64 |
| 2015/0349651 | A1* | 12/2015 | Morota | H02M 3/33523 363/21.15 |
| 2016/0241124 | A1* | 8/2016 | Tastekin | H02M 1/00 |
| 2016/0254212 | A1* | 9/2016 | Kusaka | H01L 23/34 361/699 |
| 2017/0354061 | A1* | 12/2017 | Saito | H05K 7/20636 |
| 2018/0168075 | A1* | 6/2018 | Okazaki | H02M 7/003 |
| 2020/0093037 | A1* | 3/2020 | Enright | H05K 7/20818 |

FOREIGN PATENT DOCUMENTS

| | | |
|---|---|---|
| JP | H09-232780 A | 9/1997 |
| JP | 2007-066480 A | 3/2007 |
| JP | 2009537905 A | 10/2009 |
| JP | 3163213 U | 10/2010 |
| JP | 2017163065 A | 9/2017 |
| WO | 2016117098 A1 | 7/2016 |

OTHER PUBLICATIONS

ExaScaler Inc., et al.; Press Release; Mar. 31, 2015; Partial translation provided; ., URL:http://exascaler.co.jp/wp-content/uploads/2015/03/20150331.pdf; 7 pages.

Nikkei Electronics,"Innovation of Semiconductor, Cooling, Connection Innovated with the Aim of Exa-class High-Performance Machine—Part I" Jun. 20, 2015, pp. 99-105, No. 1157, Nikkei Business Publications, Inc.; Partial Translation, 13 pages.

ExaScaler Inc., et al.; Press Release; Jun. 20, 2016; URL:http://www.exascaler.co.jp/wp-content/uploads/2016/06/20160620_1.pdf; 5 pages.

International Search Report and Written Opinion for related International Application No. PCT/JP2016/083621, dated Dec. 20, 2016; English translation of ISR provided; 9 pages.

Decision to Grant for related JP App No. 2018-549729 dated Dec. 17, 2019, 6 pgs.

* cited by examiner

ELECTRONIC DEVICE FOR LIQUID IMMERSION COOLING, POWER SUPPLY UNIT, AND COOLING SYSTEM

TECHNICAL FIELD

The present invention relates to an electronic device and a power supply unit. More specifically, the present invention relates to an electronic device immersed and directly cooled in the coolant filled in a cooling apparatus, and a power supply unit. The present invention also relates to a cooling system using the electronic device and the power supply unit. The electronic device described in the specification generally denotes the one required to exhibit super-high performance and stable operation while generating high heating value such as a supercomputer and a data center. However, they are not limited to those described above. The power supply unit refers to a unit including a voltage step-down device for stepping down a high voltage input from an external power supply (for example, DC380V, AC200V) to a DC voltage output for the electronic device (for example, DC48V (including DC47.5V), DC12V).

BACKGROUND ART

Power consumption is one of the essential factors to determine the performance limit of the supercomputer in recent years. The importance of study on saving power consumed by the supercomputer has been widely recognized. That is, the speed performance per power consumption (Flops/W) has become one of indexes for evaluating the supercomputer. The power for cooling operations accounts for approximately 45% of the power consumption of the entire data center. Reduction in the power consumption by improving cooling efficiency has been increasingly demanded.

Conventionally, the process for cooling the supercomputer and the data center has been performed through two different methods, that is, air cooling method and liquid cooling method. In general, the cooling efficiency of the liquid cooling method is better than that of the air cooling method as a result of using liquid with superior heat transfer performance to that of air. Especially, in comparison with the liquid immersion cooling system using synthetic oil, the liquid immersion cooling system using fluorocarbon-based coolant has received a lot of attention because of the advantage in regards to the maintenance work for the electronic device (specifically, for example, adjustment, inspection, repair, replacement and extension, the same applies hereinafter).

The inventor has already developed the compact liquid immersion cooling apparatus with excellent cooling efficiency suitable for the supercomputer of small-scale liquid immersion cooling type. Such apparatus has been applied to the small-sized supercomputer "Suiren" installed and operated in the high-energy accelerator research organization (Non-patent Literature 1).

The inventor has also proposed the improved liquid immersion cooling apparatus configured to allow substantial improvement in packaging density of the electronic devices subjected to the liquid immersion cooling (Non-patent Literatures 2, 3).

CITATION LIST

Non-patent Literature 1: "Small-sized liquid immersion cooling type supercomputer "ExaScaler-1" succeeded in measurement of the value corresponding to the world highest level of the latest supercomputer power consumption performance ranking "Green500" resulting from the performance improvement by 25% or higher" Mar. 31, 2015, Press Release, ExaScaler Inc., et al., URL:http://exascaler.co.jp/wp-content/uploads/2015/03/20150331.pdf Non-patent Literature 2: "Innovation of Semiconductor, Cooling, Connection, Aiming at Exa-grade High-performance Machine—Part I", July 2015 issue of Nikkei Electronics, pp. 99-105, Jun. 20, 2015, published by Nikkei Business Publications, Inc.

Non-patent Literature 3: "Supercomputer "Shoubu" has achieved the world highest level of the supercomputer power consumption performance ranking "Green500" for three consecutive quarters—Supercomputer "Satsuki" also has achieved the world second highest level—Two supercomputers in RIKEN ranked as the highest and the second highest levels in the world, respectively" Jun. 20, 2016, Press Release, ExaScaler Inc., et al., URL:http://www.exascaler.co.jp/wp-content/uploads/2016/06/20160620_1.pdf

SUMMARY OF INVENTION

Technical Problem

The electronic device applied to the liquid immersion cooling apparatus is normally provided with a power supply unit configured to step down the high voltage input supplied from the external power supply to the low voltage output for the device, for example, a processor, a storage device, or a network card for the electronic device. The power supply unit to be connected to the external power supply via the power cable is disposed at the topmost part of the electronic device so as to allow easy connection to a connector plug of the power supply cable. In the case of the liquid immersion cooling apparatus which stores several tens units of the electronic devices, for example, several tens of network cables, and several tens of thick power supply cables are wired at the upper part of those electronic devices. The above-described structure causes the problem of making the cable wiring troublesome, and disturbing efficient maintenance of the electronic device. Depending on some type of the electronic device, the power supply unit has its volume, length, and weight occupying ¼ to ⅓ of those of the entire structure of the electronic device, respectively. In order to store the long electronic device, the cooling tank (hereinafter referred to as "liquid immersion tank" on occasion) has to be designed to have the greater height (greater depth). Furthermore, as the relatively heavy power supply unit is disposed at the topmost part of the electronic device, its center of gravity, and accordingly, the center of gravity of the liquid immersion cooling apparatus as a whole is positioned at a high level, leading to the risk of bringing the apparatus unstable against large vibration caused by major earthquake or the like.

There has been required to develop the newly configured electronic device to be applied to the liquid immersion cooling apparatus without needing wiring of the power supply cable at the upper part of the electronic device, and the newly configured power supply unit adapted to the above-configured electronic device.

Meanwhile, recently, there has been proposed a system (hereinafter referred to as "HVCD system" on occasion) for supplying high voltage DC (hereinafter referred to as "HVDC") of DC380V to the electronic device such as the server installed in the data center. One of major benefits of the HVDC system is significant reduction in power loss. For example, in the case that the DC380V supplied from the external power supply is converted into DC48V so as to be supplied to the electronic device, the power lost in the electronic device may be reduced theoretically up to $\frac{1}{16}$ compared with the power loss in the conventional case of supplying DC12V. The power lost in the electronic device will be discharged as heat. Therefore, the power loss reduction is effective for improving the cooling efficiency of the liquid immersion cooling system. There has been required to develop the newly configured power supply unit which makes the liquid immersion cooling electronic device adaptable to the HVDC system.

Solution to Problem

In order to solve the above-described problem, an electronic device immersed and directly cooled in the coolant filled in the cooling apparatus according to an aspect of the present invention includes a carrier substrate having a voltage input terminal for supplying a DC voltage for the electronic device, which is electrically connected to a voltage output terminal of a power supply unit, and a supporting member for supporting the carrier substrate so as to be positioned at an upper part of the power supply unit mounted on a bottom of a cooling tank of the cooling apparatus upon electrical connection between the electronic device and the power supply unit.

In a preferred embodiment of the electronic device according to the aspect of the present invention, the supporting member may be configured to include a backboard or a frame structure, having one surface to which the carrier substrate is fixed.

In a preferred embodiment of the electronic device according to the aspect of the present invention, the backboard or the frame structure may be slidably supported by a plurality of supporting columns which are fixed and vertically projected in the cooling tank.

In a preferred embodiment of the electronic device according to the aspect of the present invention, the backboard or the frame structure may be configured to include a supporting pin or a guide pin which is inserted from above into a bracket fixed in the cooling tank.

According to another aspect of the present invention, a power supply unit immersed in a coolant filled and directly cooled in a cooling apparatus includes a unit substrate including a voltage input terminal for supplying an external power supply voltage, and a voltage output terminal electrically connected to a voltage input terminal of an electronic device, and a voltage step-down device mounted on the unit substrate. The power supply unit is mounted on a bottom of a cooling tank of the cooling apparatus so that the electronic device is positioned at an upper part of the power supply unit upon electrical connection between the electronic device and the power supply unit, and cooled by the coolant flowing from the bottom, or flowing from another section of the cooling tank.

In a preferred embodiment of the power supply unit according to the aspect of the present invention, the unit substrate may be disposed apart from the bottom so that a flow channel which allows passage of the coolant is formed between one surface of the unit substrate and the bottom.

In a preferred embodiment of the power supply unit according to the aspect of the present invention, the unit substrate may be configured to include a flow channel in the unit substrate so as to allow passage of the coolant.

In a preferred embodiment of the power supply unit according to the aspect of the present invention, the voltage step-down device may be configured to include a convertor module which steps down an external high voltage DC voltage from 200V to 420V to DC voltage from 24V to 52V.

In a preferred embodiment of the power supply unit according to the aspect of the present invention, the voltage step-down device may be configured to include a converter module which performs AC-DC conversion and voltage step-down of single-phase or three-phase external high voltage AC voltage from 100V to 250V to DC voltage from 24V to 52V.

In a preferred embodiment of the power supply unit according to the aspect of the present invention, the voltage step-down device may be configured to include any one or two or more peripheral circuits, selected from a power-factor improvement circuit, a noise filter, an additional rectifier, and a surge circuit.

The power supply unit as a preferred embodiment according to the aspect of the present invention may be configured to further include a first controller which starts voltage supply to the electronic device upon detection of a coupling state between the voltage output terminal and the voltage input terminal of the electronic device.

The power supply unit as a preferred embodiment according to the aspect of the present invention may be configured to further include a second controller which switches start/cut of voltage supply to the electronic device upon detection of an ON/OFF state of a switch which is operable from a control panel disposed either above a liquid surface of the coolant filled in the cooling tank, on a wall surface structure of the cooling tank, or around the cooling tank.

According to another aspect of the present invention, an electronic device immersed and directly cooled in a coolant filled in a cooling apparatus includes a carrier substrate having a voltage input terminal for supplying a DC voltage for the electronic device, which is electrically connected to a voltage output terminal of a power supply unit, a plurality of module connectors arranged on one surface of the carrier substrate, a plurality of module substrates, each having a module connector plug electrically coupled to each of the module connectors, a plurality of supporting plates mounted at predetermined intervals in a longitudinal direction of the carrier substrate, adjacently positioned of which hold both ends of the module substrates, respectively, and a supporting member for supporting the carrier substrate so as to be positioned at an upper part of the power supply unit mounted on a bottom of a cooling tank of the cooling apparatus upon electrical connection between the electronic device and the power supply unit.

In a preferred embodiment of the electronic device according to the aspect of the present invention, the supporting member may be configured to include a backboard or a frame structure, having one surface to which the carrier substrate is fixed.

In a preferred embodiment of the electronic device according to the aspect of the present invention, the backboard or the frame structure may be slidably supported by a plurality of supporting columns which are fixed and vertically projected in the cooling tank.

In a preferred embodiment of the electronic device according to the aspect of the present invention, the backboard or the frame structure may be configured to include a supporting pin or a guide pin which is inserted from above into a bracket fixed in the cooling tank.

In a preferred embodiment of the electronic device according to the aspect of the present invention, the backboard or the frame structure may be configured to include an outer frame, and a beam which extends in the outer frame widthwise, and the supporting plates may be attached to the outer frame and the beam.

In a preferred embodiment of the electronic device according to the aspect of the present invention, each of the supporting plates may be configured to have a plurality of grooves, each of which allows insertion of each end of the module substrates, respectively.

In a preferred embodiment of the electronic device according to the aspect of the present invention, each of the module substrates may be any one of a module substrate mounted with a processor and a memory, a module substrate mounted with a programmable logic device, a module substrate mounted with an adaptor card function for network communication, a module substrate mounted with a storage device, or a composite module substrate mounted with a combination of two or more of the processor and the memory, the programmable logic device, the adaptor card function for network communication, and the storage device.

A power supply unit according to another aspect of the present invention is immersed and directly cooled in a coolant filled in a cooling apparatus. The power supply unit includes a unit substrate having a power supply voltage input terminal for supplying an external power supply voltage, and a voltage output terminal which is electrically connected to a voltage input terminal of an electronic device, a voltage step-down device which is mounted on the unit substrate, and a stage to which the unit substrate is fixed. The power supply unit is mounted on a bottom of a cooling tank of the cooling apparatus so that the electronic device is positioned at an upper part of the power supply unit upon electrical connection between the electronic device and the power supply unit. The stage holds the unit substrate so that a flow channel which allows passage of the coolant flowing from the bottom is formed between one surface of the unit substrate and the bottom.

In a preferred embodiment of the power supply unit according to the aspect of the present invention, a plurality of spacers for forming the flow channel may be attached to the stage.

In a preferred embodiment of the power supply unit according to the aspect of the present invention, the stage may be configured to include a flat plate mounted on the bottom. The flat plate may have a hole which allows inflow of the coolant from the bottom.

In a preferred embodiment of the power supply unit according to the aspect of the present invention, a plurality of supporting columns vertically projected in the cooling tank may be mounted on the stage. The supporting columns may be configured to slidably support the backboard or the frame structure of the electronic device.

The power supply unit as a preferred embodiment according to the aspect of the present invention may be configured to further include a switch positioned either at an upper end or on a side surface of the supporting columns for switching start/cut of voltage supply to the electronic device.

In a preferred embodiment of the power supply unit according to the aspect of the present invention, the voltage step-down device may be configured to include a convertor module which steps down an external high voltage DC voltage from 200V to 420V to DC voltage from 24V to 52V.

In a preferred embodiment of the power supply unit according to the aspect of the present invention, the voltage step-down device may be configured to include a converter module which performs AC-DC conversion and voltage step-down of single-phase or three-phase external high voltage AC voltage from 100V to 250V to DC voltage from 24V to 52V.

In a preferred embodiment of the power supply unit according to the aspect of the present invention, the voltage step-down device may be configured to include any one or two or more peripheral circuits, selected from a power-factor improvement circuit, a noise filter, an additional rectifier, and a surge circuit.

The power supply unit as a preferred embodiment according to the aspect of the present invention may be configured to further include a first controller which starts voltage supply to the electronic device upon detection of a coupling state between the voltage output terminal and the voltage input terminal of the electronic device.

The power supply unit as a preferred embodiment according to the aspect of the present invention may be configured to further include a second controller which switches start/cut of voltage supply to the electronic device upon detection of an ON/OFF state of a switch operable from a control panel disposed either above a liquid surface of the coolant filled in the cooling tank, on a wall surface structure of the cooling tank, or around the cooling tank.

A cooling system according to another aspect of the present invention includes a cooling apparatus, a plurality of electronic devices immersed and directly cooled in a coolant filled in the cooling apparatus, and a plurality of power supply units immersed and directly cooled in the coolant filled in the cooling apparatus. The cooling apparatus includes a cooling tank having an open space defined by a bottom wall and side walls. A plurality of inflow openings which allow an inflow of the coolant are formed in a bottom of the cooling tank, and an outflow opening is formed around a liquid surface of the coolant circulating inside the cooling tank. Each of the electronic devices includes a voltage input terminal for supplying a DC voltage for the electronic device. Each of the power supply units includes a power supply voltage input terminal for supplying an external power supply voltage, and a voltage output terminal to be electrically connected to the voltage input terminal of the electronic device. Each of the power supply units is disposed on the bottom of the cooling tank so that the electronic device is positioned at the upper part of the power supply unit upon electrical connection between the electronic device and the power supply unit, respectively. The power supply units and the electronic devices are cooled by the coolant flowing from the bottom.

In a preferred embodiment of the cooling system according to the aspect of the present invention, each of the electronic devices may be configured to include a carrier substrate having the voltage input terminal, and a supporting member for supporting the carrier substrate.

In a preferred embodiment of the cooling system according to the aspect of the present invention, the supporting member may be configured to include a backboard or a frame structure, having one surface to which the carrier substrate is fixed.

In a preferred embodiment of the cooling system according to the aspect of the present invention, the power supply unit may be configured to include a unit substrate having a power supply voltage input terminal and a voltage output terminal, a voltage step-down device which is mounted on the unit substrate, and a stage to which the unit substrate is fixed. The stage may be configured to hold the unit substrate so that a flow channel which allows passage of the coolant flowing from the bottom is formed between one surface of the unit substrate and the bottom.

In a preferred embodiment of the cooling system according to the aspect of the present invention, a plurality of spacers for forming the flow channel may be attached to the stage.

In a preferred embodiment of the cooling system according to the aspect of the present invention, the stage may be configured to include a flat plate mounted on the bottom, having a hole which allows inflow of the coolant from the bottom.

In a preferred embodiment of the cooling system according to the aspect of the present invention, a plurality of supporting columns vertically projected in the cooling tank may be mounted on the stage. The supporting columns may be configured to slidably support the backboard or the frame structure of the electronic device.

According to the present invention, as the power supply unit is eliminated from the electronic device, wiring of the power supply cable at the upper part of the electronic device is no longer necessary. This makes it possible to simplify the cable wiring, and improve maintainability of the electronic device. It is possible to reduce the total length of the electronic device and the power supply unit according to the present invention. Therefore, the cooling tank may be designed to be shorter in height. Furthermore, the relatively heavy power supply unit is mounted on the bottom of the cooling tank so as to allow the center of gravity of the liquid immersion cooling apparatus to be positioned at a lower level, resulting in improved resistance against vibration.

In the case that the power supply unit is adapted to the HVDC system, the power lost in the electronic device may be reduced. This makes it possible to not only reduce heat generated in the electronic device but also allow the cooled coolant flowing from the bottom of the cooling tank to quickly take heat from the power supply unit mounted on the bottom of the cooling tank. This secures further improved efficiency for cooling the electronic device and the power supply unit.

The cooling tank having the "open space" as described in the specification also includes the one with a simplified sealing structure sufficient to prevent deterioration in the maintainability of the electronic device. For example, configurations which allow placement of the top plate for closing the open space of the cooling tank, and detachable attachment of the top plate via a packing and the like may be regarded as the simplified sealing structures.

The above-described objects and advantages of the present invention, and any other objects and advantages may be clearly understood by the following explanations of the embodiments. The following explanations of the embodiments are made for exemplifying purposes. The present invention, thus, is not limited thereto.

DESCRIPTION OF EMBODIMENTS

Figure 1:
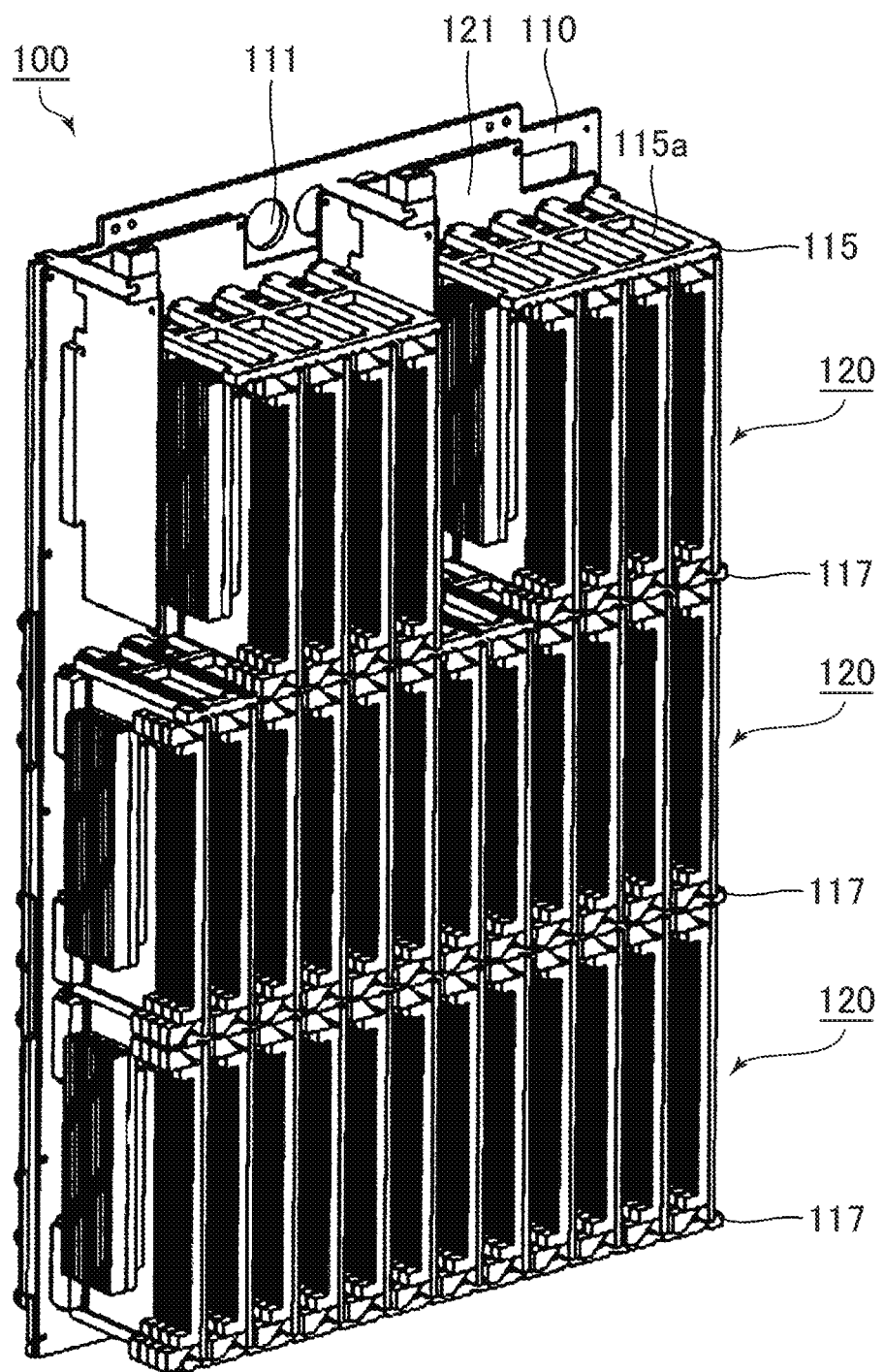
FIG. 1 is a perspective view of an electronic device according to an embodiment of the present invention.

Preferred embodiments of the electronic device, the power supply unit, and the cooling system according to the present invention will be described, respectively in detail referring to the drawings.

Figure 2:
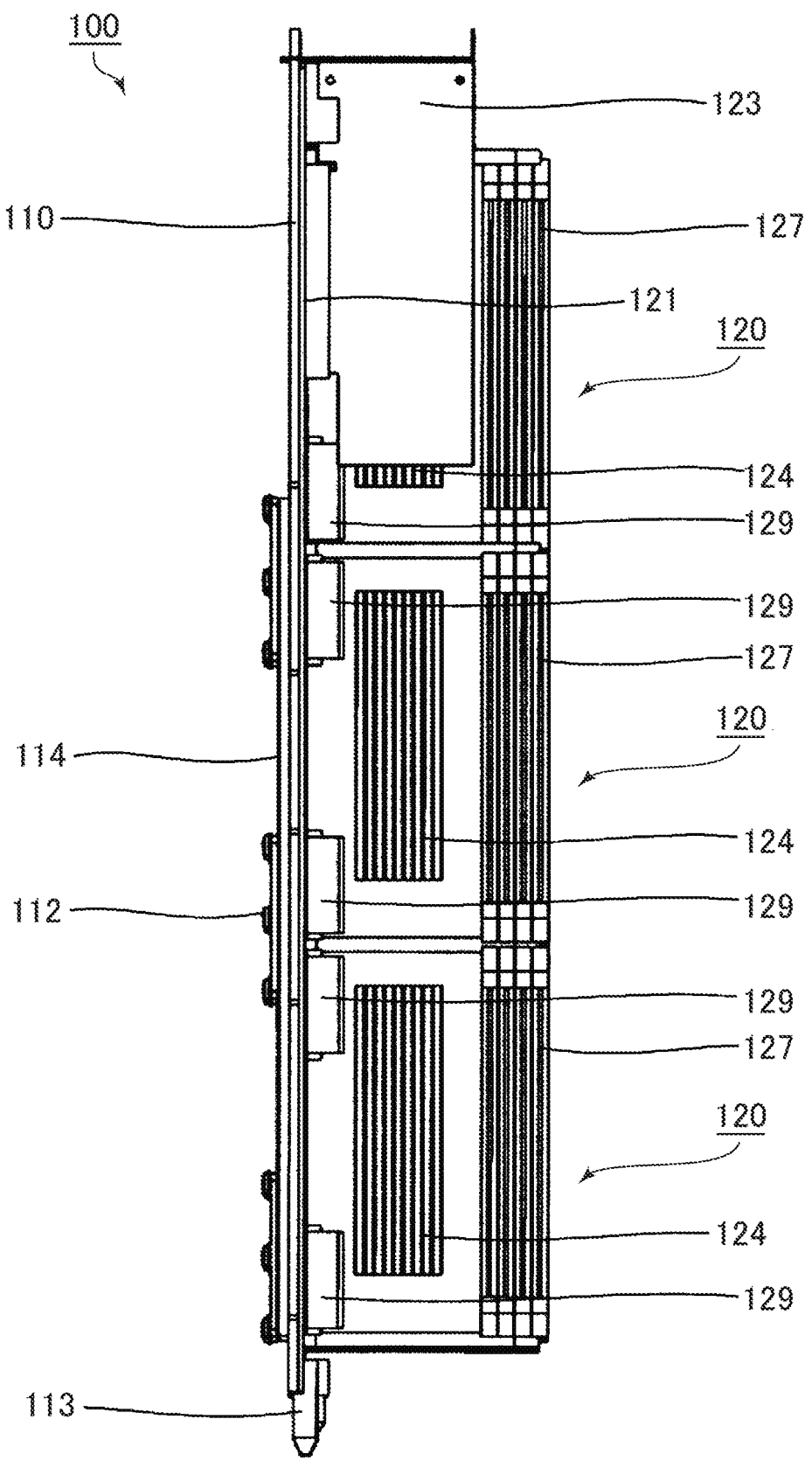
FIG. 2 is a side view of the electronic device according to the embodiment of the present invention.
Figure 3:
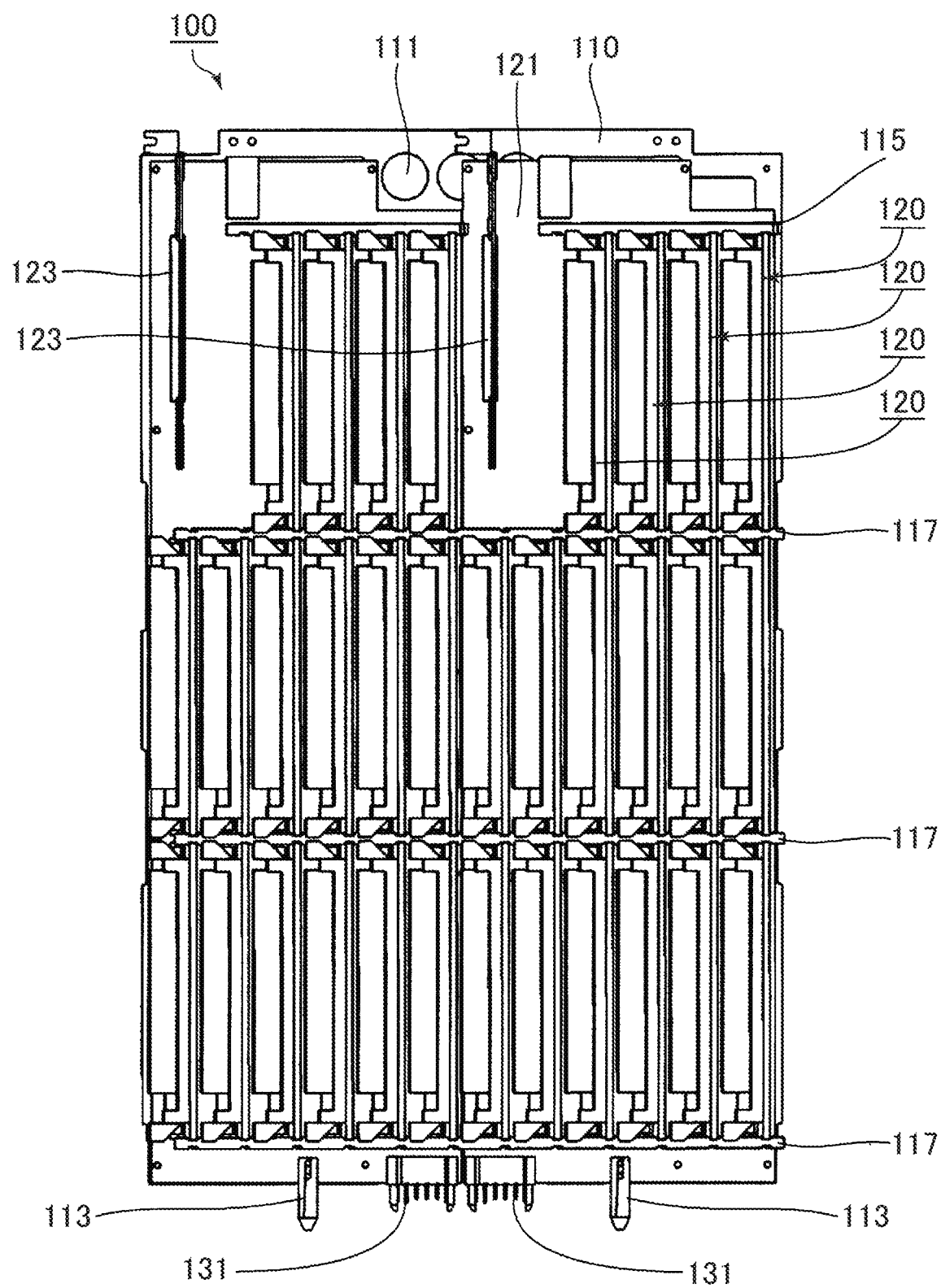
FIG. 3 is a front view of the electronic device according to the embodiment of the present invention.
Figure 4:
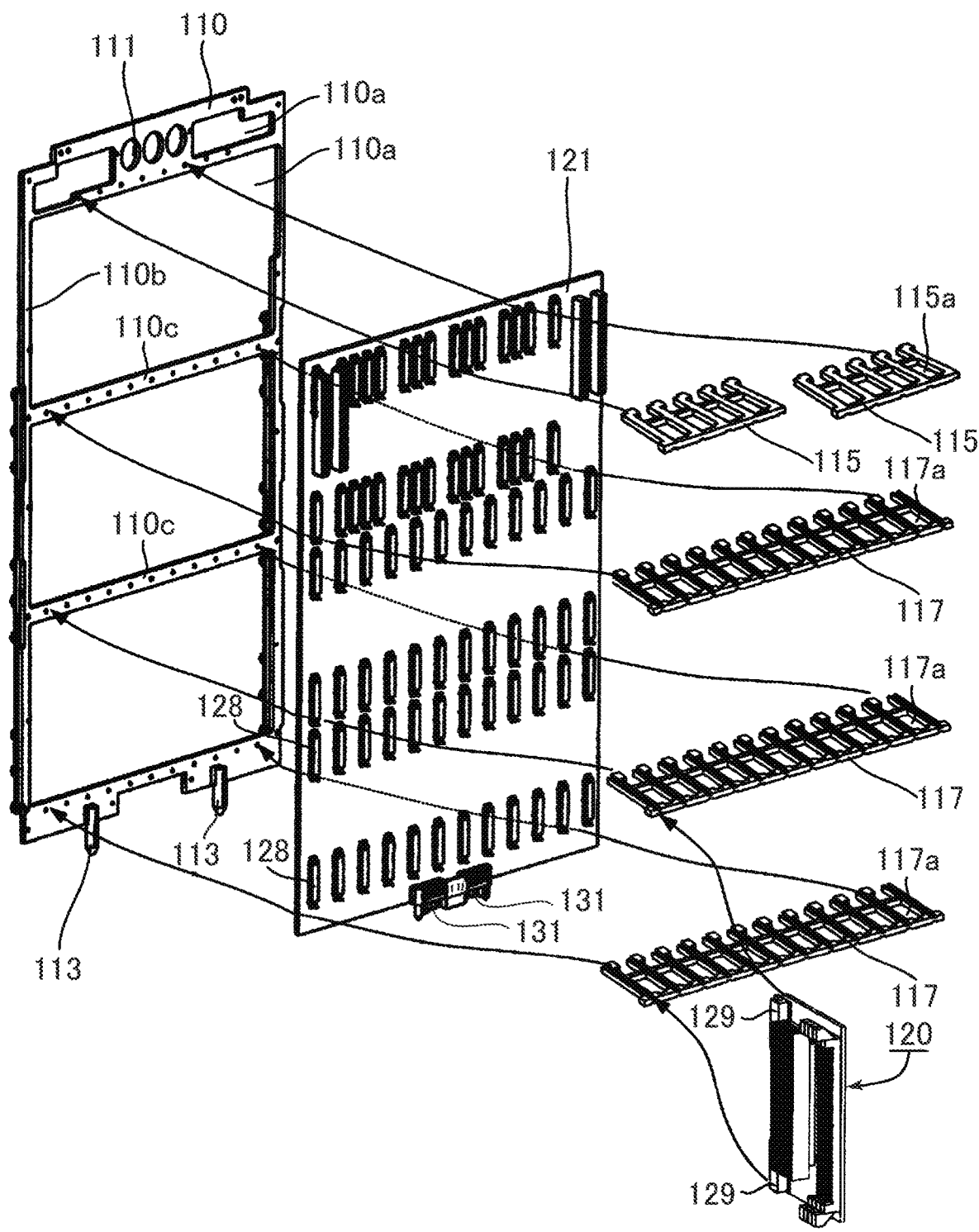
FIG. 4 is a partial assembly view of the electronic device according to the embodiment of the present invention, specifically, the assembly view showing a backboard or a frame structure, a carrier substrate, and a support plate.

Referring to FIGS. 1 to 4, an electronic device 100 according to an embodiment of the present invention will be described. FIG. 1 is a perspective view of the electronic device 100 according to the embodiment of the present invention. FIG. 2 is a side view, FIG. 3 is a front view, and FIG. 4 is a partial assembly view. The electronic device 100 is immersed and directly cooled in the coolant filled in a cooling apparatus to be described later. The electronic device 100 includes a backboard or a frame structure 110 (hereinafter simply referred to as a "backboard 110"), a plurality of module substrates 120, a carrier substrate 121, and a plurality of supporting plates 115, 117. As shown in the drawings, a power supply unit is eliminated from the electronic device 100. The power supply unit is mounted on the bottom of a cooling tank of the cooling apparatus to be described later.

The backboard 110 constitutes a supporting member for supporting the carrier substrate 121. As FIG. 4 shows, the backboard 110 includes an outer frame 110b, and beam members 110c each extending in the outer frame 110b widthwise. Formed in the upper part of the outer frame 110b are suspension fitting holes 111 which allow passage of a suspension fitting upon insertion/removal of the electronic device 100 into/from the cooling tank. The backboard 110 includes a pair of supporting pins or guide pins 113 (hereinafter simply referred to as a "supporting pin 113") extending downward from the lower part of the outer frame 110b. The multiple supporting plates 115, 117 are attached to the outer frame 110b and the beam members 110c via the respective fasteners, for example, screws each penetrating through the carrier substrate 121. As a result, the carrier substrate 121 is fixed to one surface of the backboard 110, and the multiple supporting plates 115, 117 are attached to the carrier substrate 121 at predetermined intervals in its longitudinal direction. Each of the supporting plates 115, 117 has a plurality of grooves, each of which allows insertion of each end of the multiple module substrates 120. As described above, the adjacent supporting plates 115, 117 serve to hold both ends of the respective module substrates 120.

DC voltage input connectors 131 each supplying the DC voltage for the electronic device are disposed at the lower part of the carrier substrate 121. The DC voltage input connector 131 corresponds to the voltage input terminal of the carrier substrate 121. A plurality of module connectors 128 are arranged on one surface of the carrier substrate 121. Each of the module substrates 120 includes module connector plugs 129 electrically coupled to the respective module connectors. Each of the module substrates 120 may be inserted into and pulled from the carrier substrate 121. Referring to an example shown in the drawing, two network cards 123 are attached to the carrier substrate 121. A total of 32 module substrates 120 are mounted on the carrier substrate 121. However, arbitrary number of the module substrates 120 may be mounted without being particularly limited. The module substrate 120 may be any one of the module substrate which is mounted with a processor and a memory as exemplified by the drawing (FIGS. 1 to 4 only show a processor 124 to which the heat sink is thermally connected, and a main memory socket 127, the module substrate which is mounted with a programmable logic device, the module substrate which is mounted with an adapter card function for network communication, the module substrate which is mounted with the storage device, or a composite module substrate formed by mounting a combination of two or more of the processor and the memory, the programmable logic device, the adapter card function for network communication, and the storage device. However, the module substrate is not limited to those described above. For example, it is possible to use the semiconductor device of a system on-chip type design for the processor (Intel Xeon processor D product family of Intel Corporation). It is possible to use the general 32 GB DDR4 (Double-Data-Rate4) VLP DIMM (very low profile Dual Inline Memory Module) as a memory module which is very short in height for the main memory. It is possible to use FPGA (Field-Programmable Gate Array) for the programmable logic device. Furthermore, it is possible to use the device conforming to Ethernet or InfiniBand as the adaptor card function for network communication. It is possible to use the flash storage, for example, M.2 SSD (Solid State Drive), or mSATA SSD for the storage device.

Referring to FIGS. 2 and 4, a plurality of sliders 112 are attached to the surface opposite the one surface of the backboard 110 via a slider holder 114 along a longitudinal direction of the outer frame 110b of the backboard 110. The pair of sliders 112 at left and right sides of the outer frame 110b are brought into engagement with rail grooves famed in adjacent supporting columns, respectively, which are fixed while being vertically projected in the cooling tank as described later so that the backboard 110 is slidably (vertically movable) supported.

Upon immersion and direct cooling of the above-structured electronic device 100, the backboard 110 is slid relative to the multiple supporting columns so that the coolant circulating inside the electronic device passes from the lower section to the upper section of the electronic device 100 in the order of a hole 117a famed in the supporting plate 117, a space between the adjacent module substrates 120, the hole 117a, the space between the adjacent module substrates 120, the hole 117a, the space between the adjacent module substrates 120, and a hole 115a famed in the supporting plate 115 while quickly and efficiently taking heat from the module substrates 120 and the carrier substrate 121. This secures stable operations of the electronic devices 100 which are mounted with high density. It is also possible to mount the respective module substrates 120 on the carrier substrate 121, and to demount them therefrom. This allows adjustment, inspection, repair, replacement, extension and the like to be performed for the individual module substrate 120, leading to significantly improved maintainability.

Figure 5:
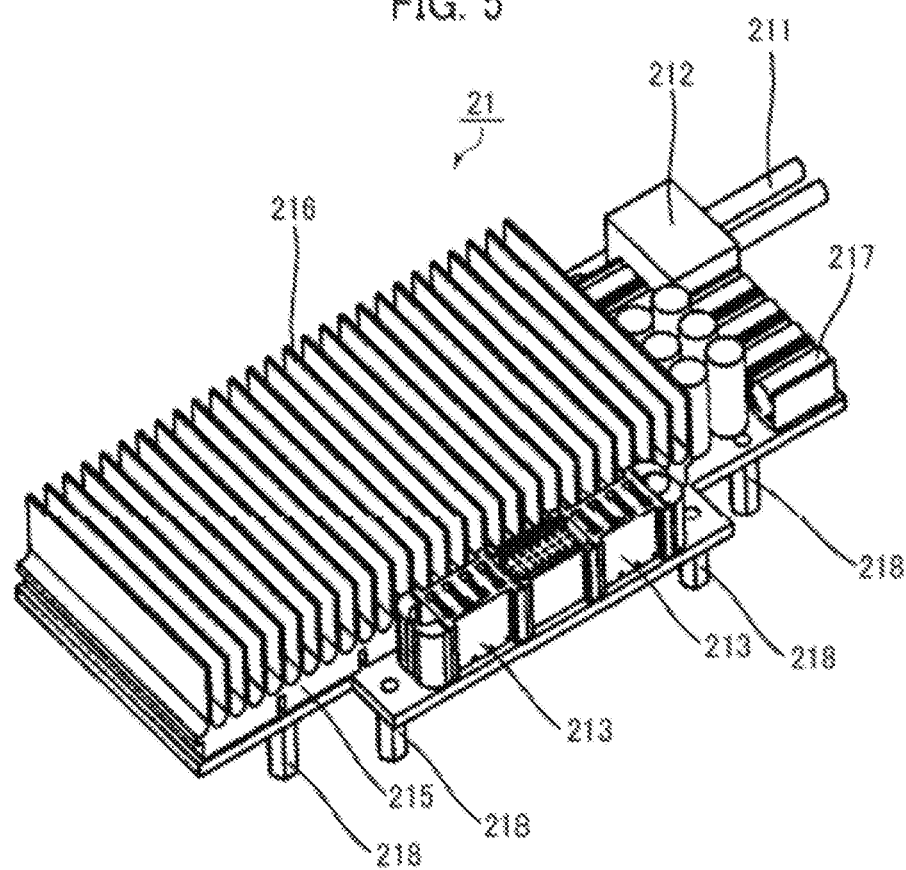
FIG. 5 is a perspective view showing an example of a unit substrate of a power supply unit according to an embodiment of the present invention.
Figure 6:
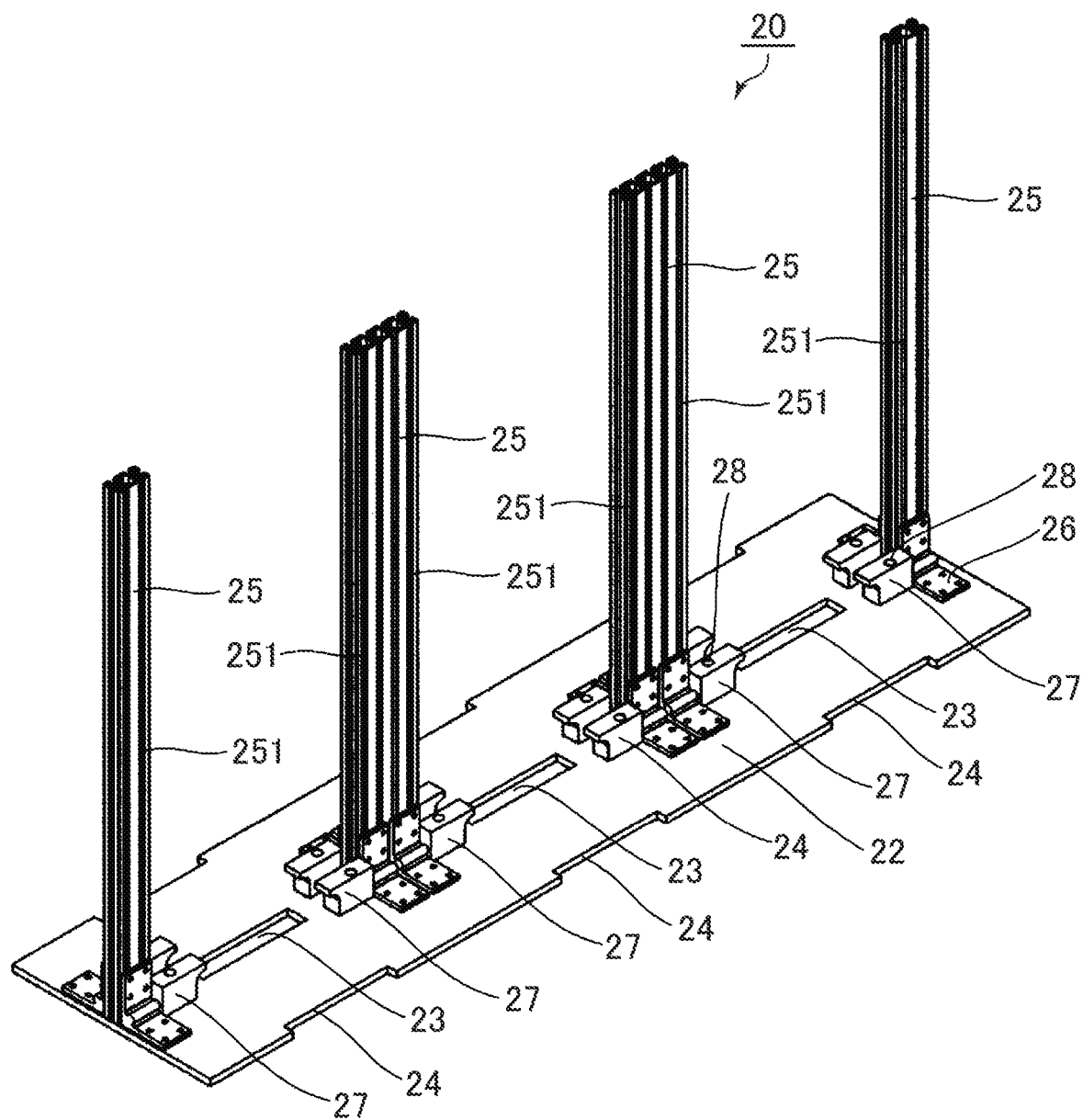
FIG. 6 is a perspective view showing an example of a stage of the power supply unit according to the embodiment of the present invention.
Figure 7:
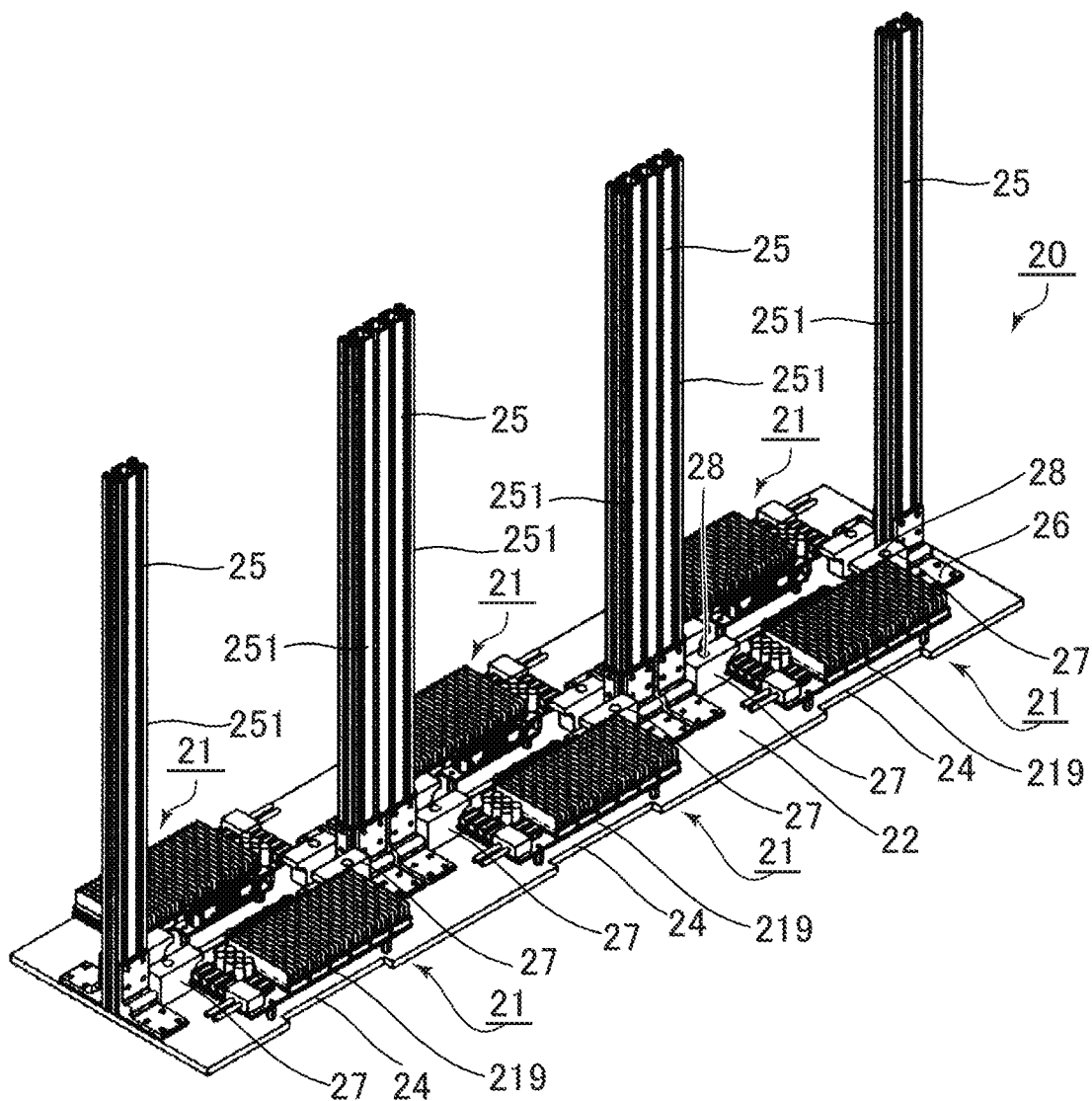
FIG. 7 is a perspective view showing a state where the unit substrates are mounted on the stage.
Figure 8:
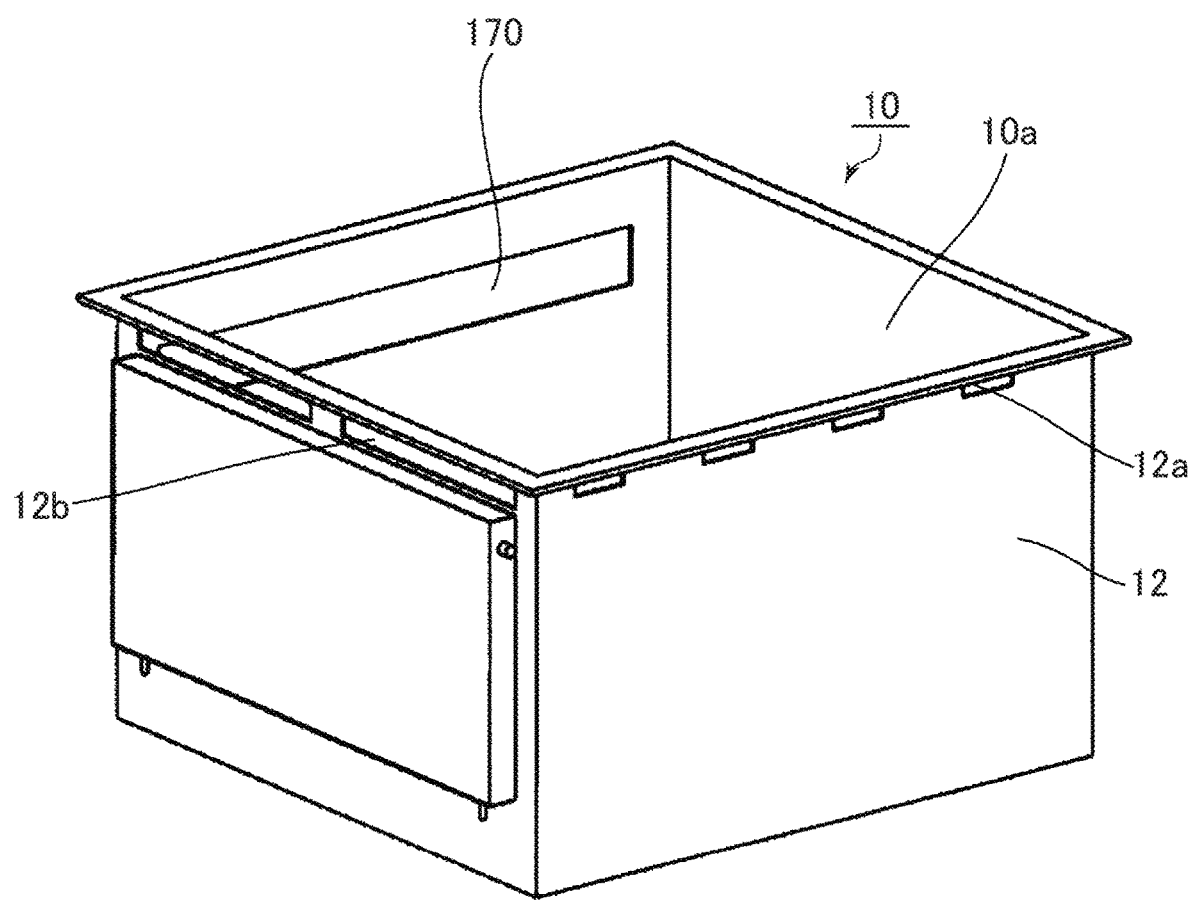
FIG. 8 is a perspective view showing a cooling tank of a cooling apparatus in a cooling system according to an embodiment of the present invention.
Figure 9:
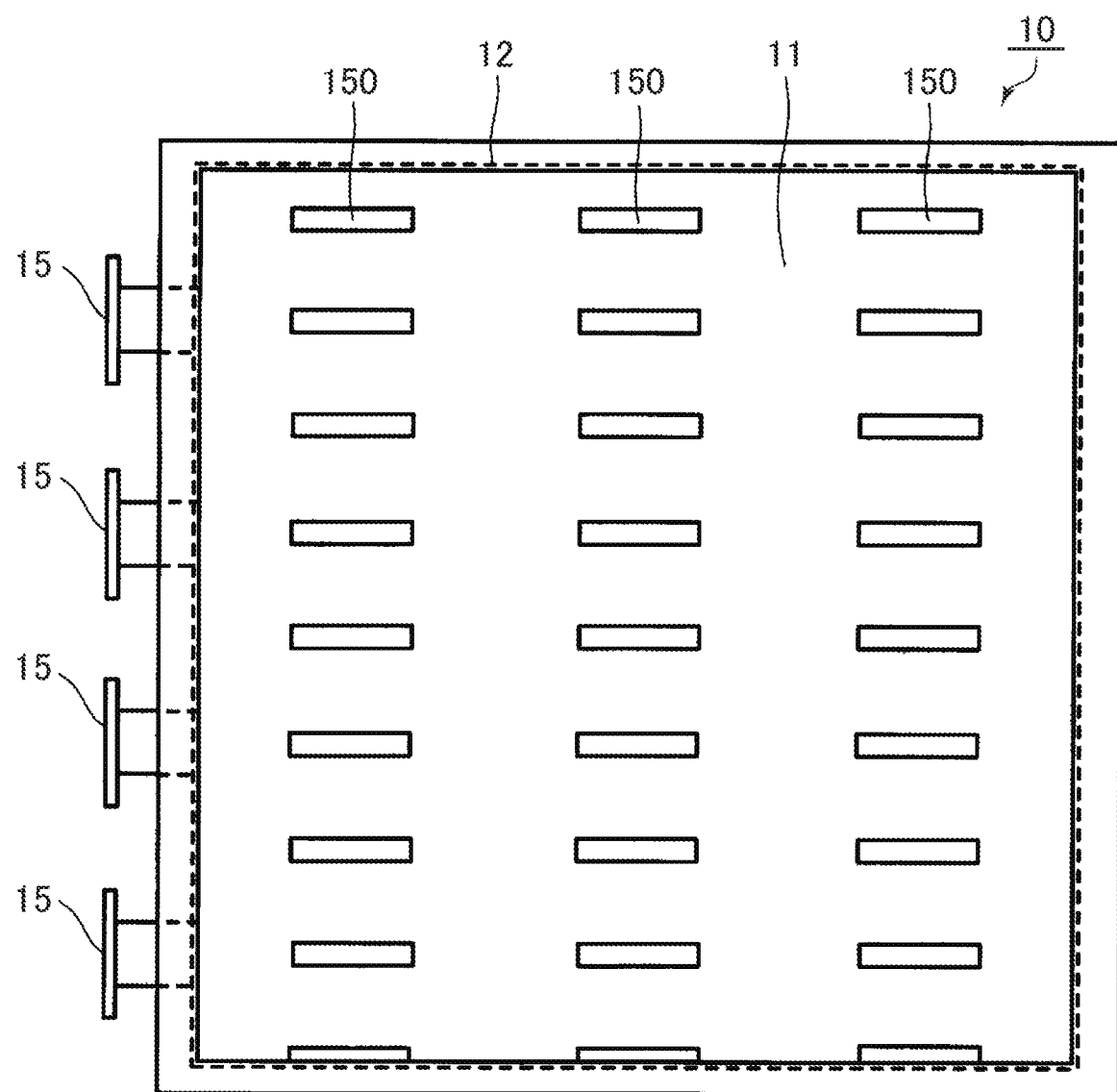
FIG. 9 is a plan view showing the cooling tank of the cooling apparatus in the cooling system according to the embodiment of the present invention.

Referring to FIGS. 5 to 7, a power supply unit 20 according to an embodiment of the present invention will be described. FIG. 5 is a perspective view showing an example of a unit substrate 21 of the power supply unit 20 according to the embodiment of the present invention. FIG. 6 is a perspective view showing an example of a stage 22 of the power supply unit 20 according to the embodiment of the present invention. FIG. 7 is a perspective view representing a state in which the unit substrates 21 are mounted on the stage 22.

Figure 5A:
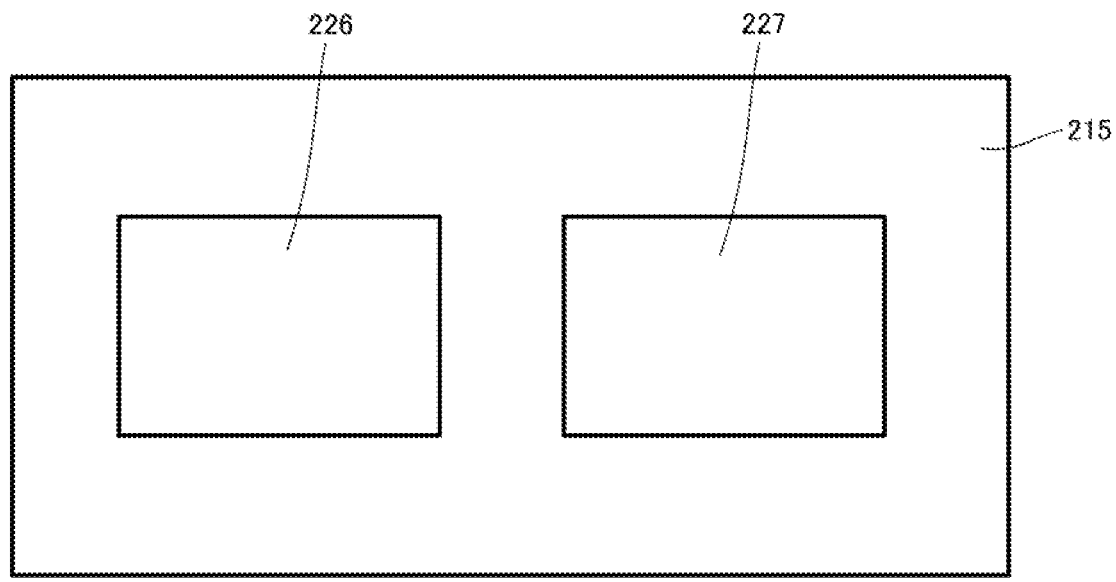
FIG. 5A is a diagram showing an example of voltage step-down device.

As described above, the power supply unit 20 which is not a component of the electronic device 100 is mounted on a bottom of the cooling tank of the cooling apparatus. The power supply unit 20 includes the unit substrate 21, and a voltage step-down device 215 mounted on the unit substrate 21. The unit substrate 21 includes a power supply voltage input connector 212 which supplies an external power supply voltage from the external power supply (not shown) via a power supply cable 211, and a DC voltage output connector 213 which outputs a DC voltage that has been stepped down by the voltage step-down device 215. The power supply voltage input connector 212 corresponds to the voltage input terminal of the unit substrate 21, and the DC voltage output connector 213 corresponds to the voltage output terminal. Preferably, as shown in FIG. 5A, the voltage step-down device 215 includes a converter module 226 which steps down the external high voltage DC voltage from 200V to 420V to DC voltage from 24V to 52V, or a converter module 226, which executes AC-DC conversion and voltage step-down of the single-phase or three-phase external high voltage AC voltage from 100V to 250V to the DC voltage from 24V to 52V. Preferably, the former converter module allows the voltage step-down of DC 380V to DC 48V, and the latter converter module allows AC-DC conversion and voltage step-down of AC 200V to DC 48V. Preferably, when necessary, the voltage step-down device 215 includes one or two peripheral circuits 227 or more, selected from a power-factor improvement circuit, a noise filter, an additional rectifier, and a surge circuit. It is preferable to thermally connect a heat sink 216 for heat radiation to the surface of the voltage step-down device 215. It is also preferable that the unit substrate 21 includes a plurality of input fuses 217 for protection upon failure. The unit substrate 21 is fixed to the stage 22 via a plurality of spacers 218 as shown in FIGS. 5 and 7. As a result, the unit substrate 21 is provided apart from the bottom so that a flow channel 219 which allows passage of the coolant is defined by the one surface of the unit substrate 21 and the bottom of the cooling tank to be described later. The unit substrate 21 may be configured to include a flow channel which allows passage of the coolant. For example, the unit substrate 21 may be configured as a layered structure having an intermediate space or a hollow structure, through which the coolant flows inside the above-described structure.

As shown in FIG. 6, the stage 22 includes a flat plate disposed on the bottom of the cooling tank to be described below. A plurality of holes 23 into which the coolant flows from the bottom are famed in substantially the center of the flat plate in the width direction at intervals in the longitudinal direction. A plurality of notches 24 are formed at ends of the flat plate in the width direction at intervals in the longitudinal direction. Each of the adjacent notches 24 which abut on each other includes a length and a width required to define the hole substantially the same as the hole 23 in the state that multiple stages 22 are arranged in sequence. The supporting columns 25 are vertically mounted on the stage 22 using L-type brackets 26. In the case that the stage 22 is disposed on the bottom of the cooling tank, the supporting columns 25 will be vertically projected in the cooling tank. A plurality of brackets 27 each having a supporting pin insertion hole 28 are fixed to the stage 22.

Each of the supporting columns 25 has a rail groove 251. A pair of sliders 112 of the backboard 110 of the electronic device 100 are brought into engagement with the respective rail grooves 251 formed in the adjacent supporting columns so that the backboard 110 is slidably (vertically movable) supported.

The electronic device 100 may be elevated or lowered with respect to the power supply unit 20 by sliding the backboard 110 relative to the supporting columns 25. When the electronic device 100 is lowered, the pair of supporting pins 113 extending downward from the lower part of the outer frame 110b of the electronic device 100 are inserted into the supporting pin insertion holes 28 of the pair of brackets 27 fixed to the power supply unit 20. As a result, the DC voltage output connector 213 of the power supply unit 20 and the DC voltage input connector 131 of the electronic device 100 may be positionally aligned with accuracy. When the electronic device 100 is further lowered, the DC voltage output connector 213 and the DC voltage input connector 131 are electrically connected. At this time, the pair of supporting columns 25 and the pair of brackets 27 support the weight of the single unit of the electronic device 100.

It is preferable that the power supply unit 20 includes a first controller configured to start the DC voltage supply to the electronic device 100 upon detection of coupling between the DC voltage output connector 213 and the DC voltage input connector 131 of the electronic device 100. The first controller may be mounted on the unit substrate 21 as an additional circuit or an electronic mechanism. Lowering of the electronic device 100 into the cooling tank so as to be coupled to the power supply unit 20 allows activation of the plug-in of the electronic device 100 for immediate electric current application.

It is preferable that the power supply unit 20 further includes a second controller configured to switch start/cut of voltage supply to the electronic device 100 upon detection of an ON/OFF state of the switch operable from a control panel disposed at the position either above the liquid surface of the coolant filled in the cooling tank, on the wall surface structure of the cooling tank, or around the cooling tank. This allows an operator to manually switch an ON/OFF state of each of the electronic devices 100, resulting in improved maintainability. The second controller may also be mounted on the unit substrate 21 as the additional circuit or the electronic mechanism.

It is preferable to provide the switch that sends a signal for switching start/cut of voltage supply to the electronic device 100 to the second controller at each upper end, or each side surface of the respective supporting columns 25.

Based on the drawings, an explanation will be made with respect to a preferred embodiment of a liquid immersion cooling apparatus in which the above-described electronic devices 100 and the power supply units 20 according to the respective embodiments of the present invention are immersed and directly cooled in the coolant. The embodiment describes a structure of a high density liquid immersion cooling apparatus in which 24 units of the respective electronic devices 100 and 24 units of the power supply units 20 are stored and cooled in sections of the cooling tank in a 6×4 arrangement, respectively. As the explanation will be made only for explanatory purpose, the number of units of the electronic devices for the high density liquid immersion cooling apparatus may be arbitrarily determined. The structure of the electronic device usable for the present invention is not particularly limited.

Referring to FIGS. 8 to 12, a liquid immersion cooling apparatus 1 according to the embodiment includes a cooling tank 10. An open space 10a is defined by a bottom wall 11 and side walls 12 of the cooling tank 10. A plurality of inflow openings 150 which allow inflow of the coolant are formed in the bottom wall (bottom) 11 arranged in a pattern of 9×3. The side walls 12 include power supply cable introduction ports 12a, a network cable introduction port 12b, and an inflow opening 170 which is formed around the liquid surface of the coolant.

The liquid immersion cooling apparatus 1 includes a top plate 10b for closing the open space 10a of the cooling tank 10. The top plate 10b is removed from the opening to open the open space 10a upon the work for maintaining the liquid immersion cooling apparatus 1, and is put on the opening of the cooling tank 10 to close the open space 10a upon operation of the liquid immersion cooling apparatus 1.

Figure 10:
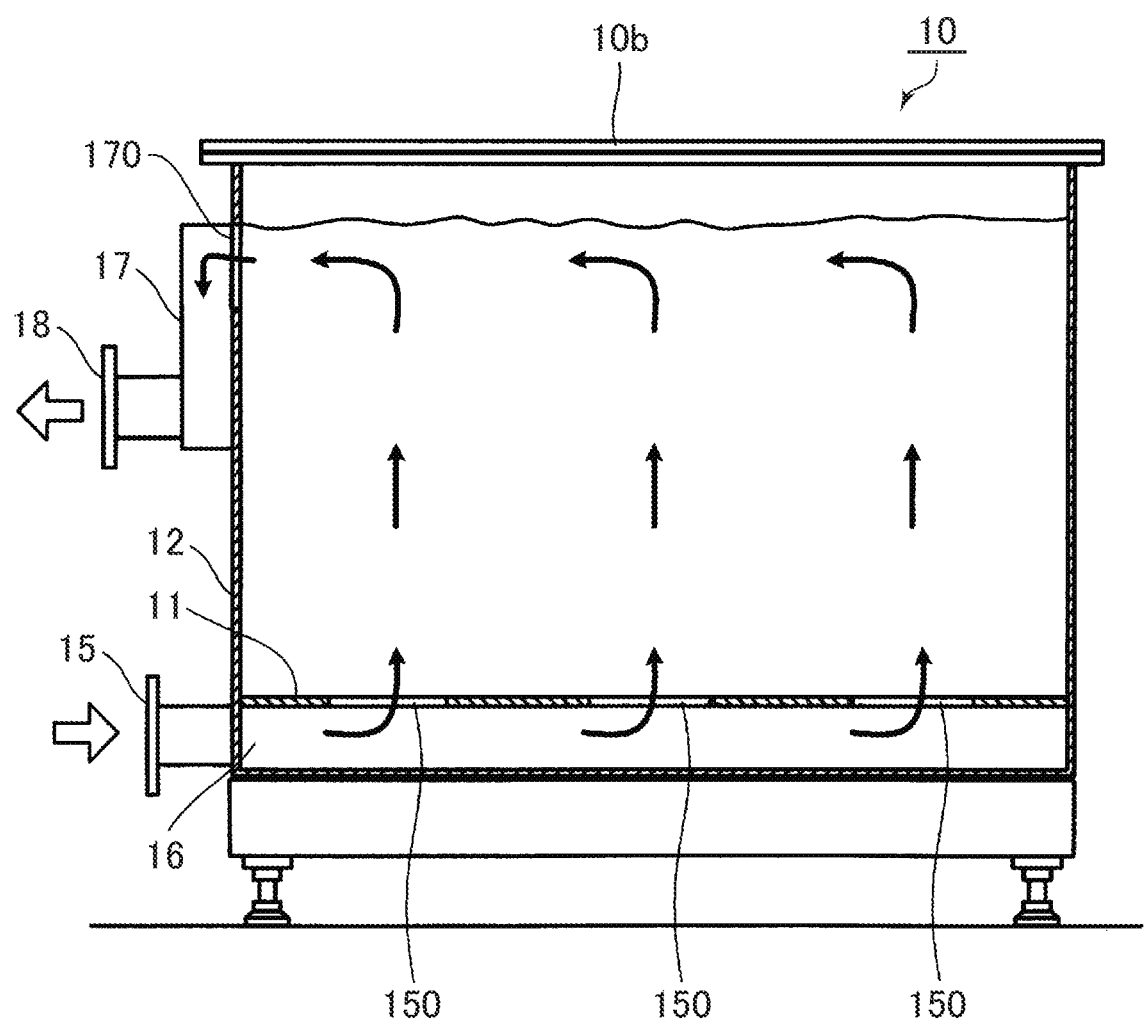
FIG. 10 is a partial sectional view of the cooling apparatus in the cooling system according to the embodiment of the present invention.

The coolant is filled in the cooling tank 10 up to the liquid surface sufficient to immerse the entire body of the electronic device 100 (see FIG. 10). As the coolant, it is possible to use a fluorine based inert liquid formed of the complete fluoride (perfluorocarbon compound) well known as "Fluorinert (trademark of 3M Company, the same applies hereinafter) FC-72" (boiling point: 56° C.), "Fluorinert FC-770" (boiling point: 95° C.), "Fluorinert FC-3283" (boiling point: 128° C.), "Fluorinert FC-40" (boiling point: 155° C.), "Fluorinert FC-43" (boiling point: 174° C.), all of which are manufactured by 3M Company. However, the arbitrary coolant may be used in a nonrestrictive way. The use of Fluorinert FC-40, Fluorinert FC-43 at the boiling point higher than 150° C., each of which hardly evaporates is advantageous for keeping the liquid level height in the cooling tank 10 for a long period of time.

Disposed below the bottom wall 11 of the cooling tank 10 are a plurality of inflow headers 16 each having an inlet 15 for the coolant at an end. Disposed outside the side wall 12 of the cooling tank 10 is a receiver 17 having an outlet 18 for the coolant. The receiver 17 covers the inflow opening 170 so as to receive the coolant flowing therefrom without leakage.

Figure 11:
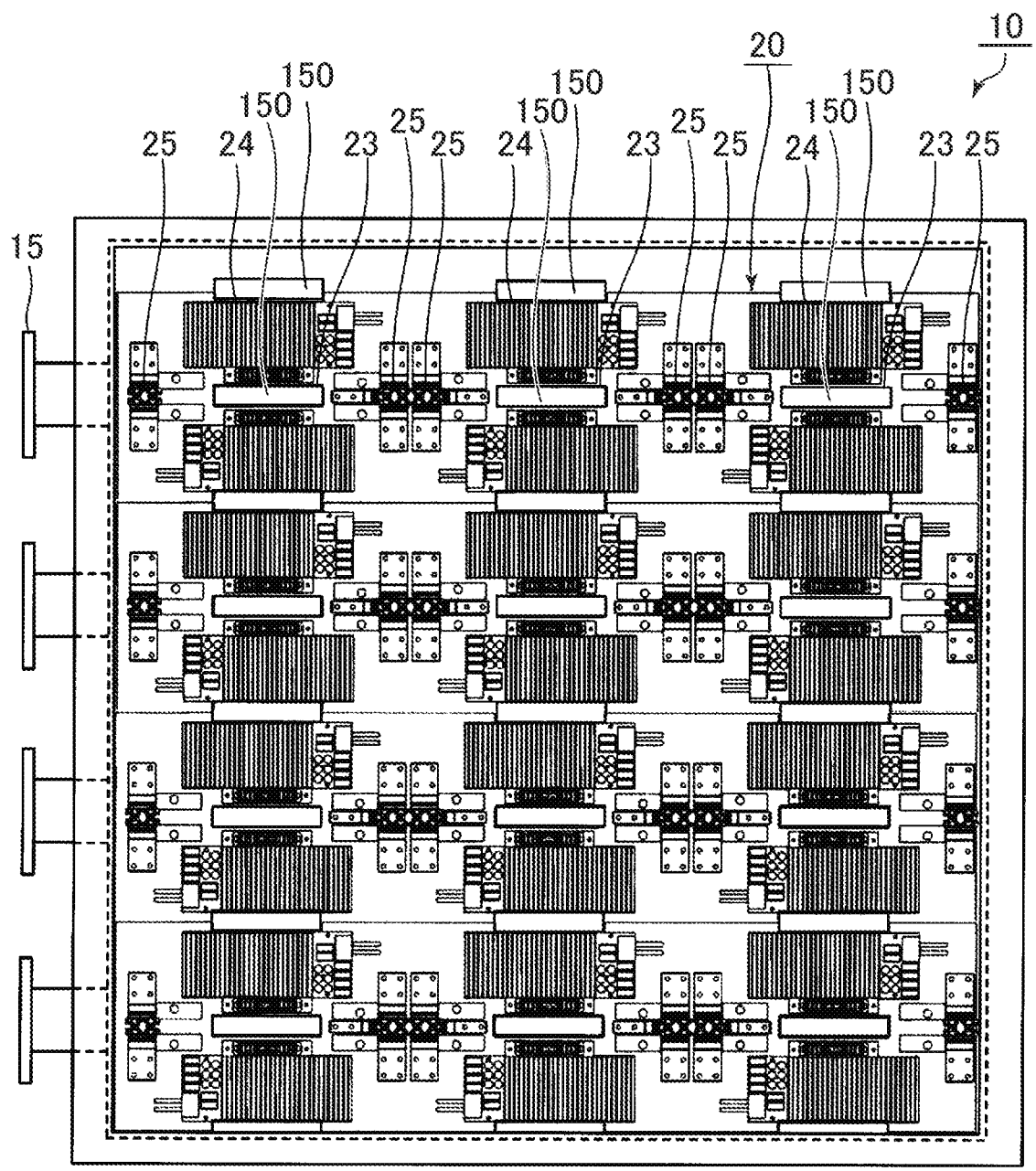
FIG. 11 is a plan view showing an example in which four stages each having the unit substrates mounted thereon are arranged on the bottom of the cooling tank.
Figure 12:
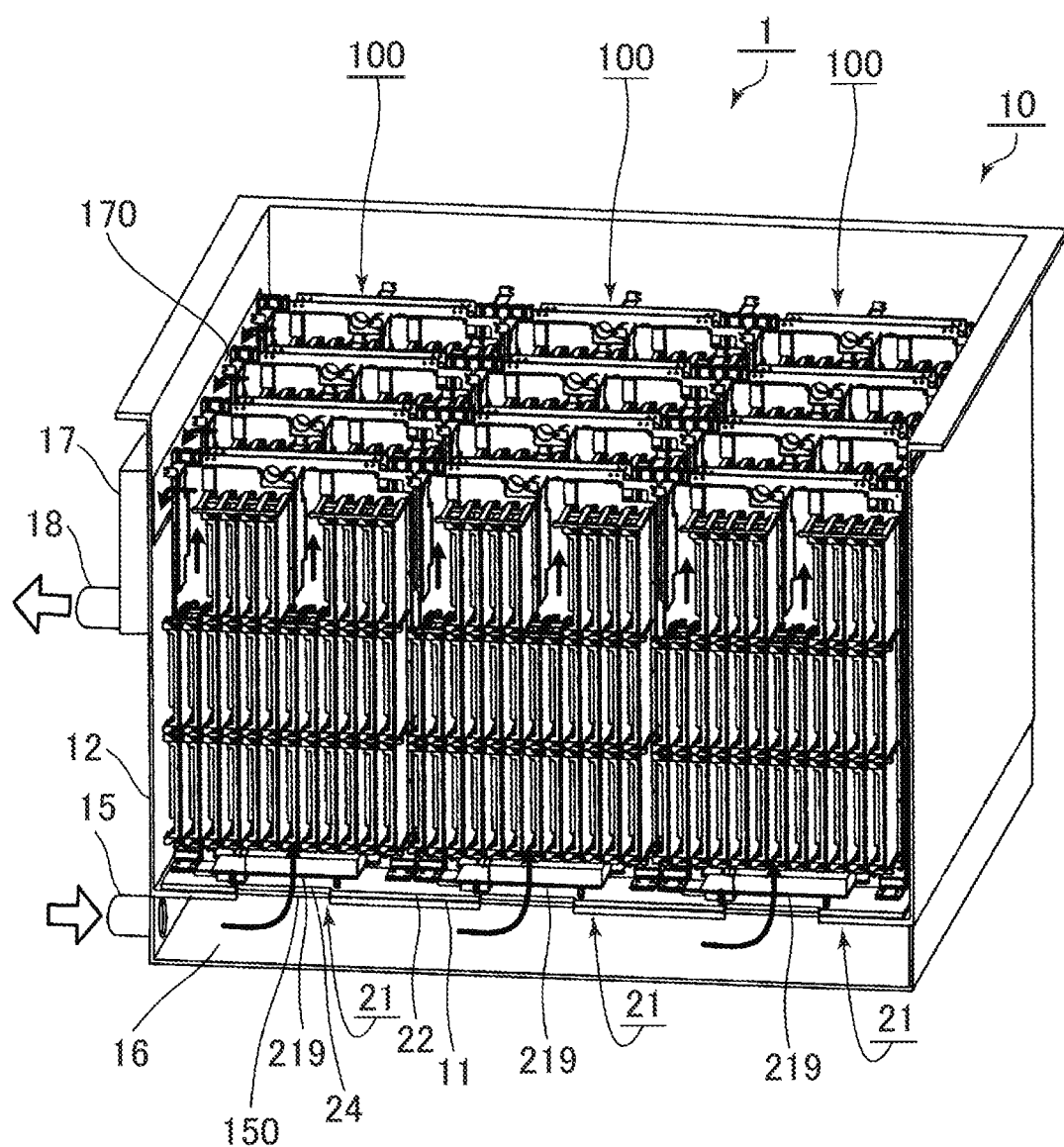
FIG. 12 is a sectional perspective view showing an essential structure of a liquid immersion cooling apparatus.

Referring to FIG. 11, four tabular stages 22 are arranged in parallel on the bottom wall 11 of the cooling tank 10. The multiple holes 23 formed in the respective stages 22, and holes each defined by the adjacent notches 24 in abutment on each other, which are substantially the same as the holes 23 correspond to the inflow openings 150, respectively. Therefore, the inflow of the coolant flowing from the inflow openings 150 is not disturbed by the power supply units 20. The flow channel which allows passage of the coolant is formed between the unit substrate 21 and the stage 22 (bottom wall 11) of the power supply unit 20 so that the coolant quickly and efficiently takes heat from both surfaces of the unit substrate 21. This secures excellent efficiency for cooling the power supply unit 20. Furthermore, as the unit substrate 21 of the power supply unit 20 may be disposed parallel to the bottom wall 11 of the cooling tank 10, it is possible to make the height of the power supply unit 20 shorter than usual in the height (depth) direction of the cooling tank 10. The total length of the electronic device 100 and the power supply unit 20 may be made short so that the cooling tank 10 is designed to be short in height (shallow depth).

Additionally, the coolant flowing from the inflow openings 150 passes from the lower side to the upper side of the electronic device 100 in the order of the hole 117a formed in the supporting plate 117, the space between the adjacent module substrates 120, the hole 117a, the space between the adjacent module substrates 120, the hole 117a, the space between the adjacent module substrates 120, and the hole 115a formed in the supporting plate 115 while quickly and efficiently taking heat from the module substrates 120 and the carrier substrate 121. The thus warmed coolant reaches the outlet 18 after passing through the outflow openings 170 and the receiver 17. A wiring (not shown) which reaches the inlet 15 after passing through a heat exchanger (not shown) is connected to the outlet 18. The coolant is cooled by the heat exchanger so that the cooled coolant is supplied to the inlet 15.

The liquid immersion cooling apparatus 1 according to the embodiment of the present invention is configured to have all the power supply units 20 fixed to the stages 22. The six electronic devices 100 above the single stage 22 may be removed so that the stage 22 is lifted to demount the power supply units 20 from the cooling tank 10. This allows adjustment, inspection, repair, replacement, extension, or any other work applied to the power supply units 20. The power supply cable 211 connected to the respective power supply units 20 may be passed through the space between the lower part of the electronic device 100 and the stage 22. The power supply cable 211 may be introduced from the power supply cable introduction port 12a, and drawn to the power supply voltage input connector 212 of the unit substrate 21 along the side wall 12 while passing on the bottom of the cooling tank without requiring the wiring at the upper part of the electronic device 100. This makes it possible to simplify the cable wiring, and improve the maintainability of the electronic device.

INDUSTRIAL APPLICABILITY

The present invention may be widely applied to the liquid immersion cooing electronic devices mounted with super high density.

REFERENCE SIGNS LIST

1: liquid immersion cooling apparatus,
10: cooling tank,
10a: open space,
10b: top plate,
11: bottom wall,
12: side wall
12a: power supply cable introduction port,
12b: network cable introduction port,
100: electronic device,
110: backboard or frame structure,
110a: hole,
110b: outer frame,
110c: beam,
111: suspension fitting hole,
112: slider,
113: supporting pin or guide pin,
114: slider holder,
115, 117: supporting plate,
115a, 117a: hole,
120: module substrate,
121: carrier substrate,
123: network card,
124: processor,
127: main memory socket,
128: module connector,
129: module connector plug,
131: DC voltage input connector,
15: inlet,
150: inflow opening,
16: inflow header,
17: receiver,
170: outflow opening,
18: outlet,
20: power supply unit,
21: unit substrate,
211: power supply cable,
212: power supply voltage input connector,
213: DC voltage output connector,
215: voltage step-down device (converter module),
216: heat sink,
217: input fuse,
218: spacer,
219: flow channel,
22: stage,
23: hole,
24: notch,
25: supporting column,
251: rail groove,
26: L-type bracket,
27: bracket,
28: supporting pin insertion hole

The invention claimed is:

1. A power supply unit which is immersed and directly cooled in a coolant filled in a cooling apparatus, comprising:
a unit substrate including a voltage input terminal for supplying an external power supply voltage, and a voltage output terminal, the voltage output terminal being electrically connected to a voltage input terminal of an electronic device, wherein a first face of the unit substrate opposes a face of a bottom of a cooling tank of the cooling apparatus and wherein the voltage input terminal and the voltage output terminal are mounted on a second face of the unit substrate, the second face being on an opposite side of the first face of the unit substrate; and
a voltage step-down device mounted on the unit substrate, wherein the power supply unit is mounted on the bottom of the cooling tank of the cooling apparatus such that the electronic device is positioned inside the cooling tank and at an upper part of the power supply unit upon electrical connection between the electronic device and the power supply unit, and the electronic device and the power supply unit are immersed and cooled by the coolant, the coolant flowing from the bottom, or flowing from another section of the cooling tank.

2. The power supply unit according to claim 1, wherein the unit substrate is disposed apart from the bottom so that a flow channel which allows passage of the coolant is formed between the first face of the unit substrate and the bottom.

3. The power supply unit according to claim 1, wherein the unit substrate includes a flow channel in the unit substrate so as to allow passage of the coolant.

4. The power supply unit according to claim 1, wherein the voltage step-down device includes a convertor module which steps down an external high voltage DC voltage from 200V to 420V to DC voltage from 24V to 52V.

5. The power supply unit according to claim 1, wherein the voltage step-down device includes a converter module which performs AC-DC conversion and voltage step-down of single-phase or three-phase external high voltage AC voltage from 100V to 250V to DC voltage from 24V to 52V.

6. The power supply unit according to claim 5, wherein the voltage step-down device includes any one or two or more peripheral circuits, selected from a power-factor improvement circuit, a noise filter, an additional rectifier, and a surge circuit.

7. The power supply unit according to claim 1, further comprising a first controller which starts voltage supply to the electronic device upon detection of a coupling state between the voltage output terminal and the voltage input terminal of the electronic device.

8. The power supply unit according to claim 1, further comprising a second controller which switches start/cut of voltage supply to the electronic device upon detection of an ON/OFF state of a switch operable from a control panel disposed either above a liquid surface of the coolant filled in the cooling tank, on a wall surface structure of the cooling tank, or around the cooling tank.

9. The power supply unit according to claim 1, wherein the voltage input terminal is oriented to extend substantially parallel to the first face of the unit substrate.

10. The power supply unit according to claim 1, wherein the voltage output terminal is oriented to extend substantially orthogonal to the first face of the unit substrate.

* * * * *